(12) United States Patent
Takatsuka et al.

(10) Patent No.: US 10,688,876 B2
(45) Date of Patent: Jun. 23, 2020

(54) BATTERY CHARGING DEVICE, BATTERY CHARGING SYSTEM, AND BATTERY CHARGING METHOD

(71) Applicant: OMRON CORPORATION, Kyoto-shi, Kyoto (JP)

(72) Inventors: Hiromasa Takatsuka, Tokyo (JP); Kazuki Kasai, Tokyo (JP)

(73) Assignee: OMRON Corporation, Kyoto-shi (JP)

( * ) Notice: Subject to any disclaimer, the term of this patent is extended or adjusted under 35 U.S.C. 154(b) by 2 days.

(21) Appl. No.: 15/759,224

(22) PCT Filed: Nov. 2, 2016

(86) PCT No.: PCT/JP2016/082664
§ 371 (c)(1),
(2) Date: Mar. 11, 2018

(87) PCT Pub. No.: WO2017/094431
PCT Pub. Date: Jun. 8, 2017

(65) Prior Publication Data
US 2018/0257505 A1    Sep. 13, 2018

(30) Foreign Application Priority Data

Dec. 1, 2015    (JP) ................................. 2015-234858

(51) Int. Cl.
*H02J 7/36* (2006.01)
*B60L 11/18* (2006.01)
(Continued)

(52) U.S. Cl.
CPC ............. *B60L 11/1861* (2013.01); *B60L 3/12* (2013.01); *B60L 53/00* (2019.02); *B60L 53/80* (2019.02);
(Continued)

(58) Field of Classification Search
CPC .......... B60L 53/80; B60L 53/00; B60L 53/13; G01R 31/3828
See application file for complete search history.

(56) References Cited

U.S. PATENT DOCUMENTS 8,896,269 B2 * 11/2014 Zhao ................... H01M 10/441
320/133
9,859,723 B2 * 1/2018 Chae ....................... B60L 58/16
(Continued)

FOREIGN PATENT DOCUMENTS

EP    2466719 A1    6/2012
EP    2662949 A1    11/2013
(Continued)

OTHER PUBLICATIONS

The extended European search report (EESR) dated Dec. 13, 2018 in a counterpart European patent application.
(Continued)

*Primary Examiner* — Dominic E Hawkins
(74) *Attorney, Agent, or Firm* — Metrolex IP Law Group, PLLC

(57) ABSTRACT

A battery charging device (30) is a battery charging device that charges a battery (10) used in vehicle (20), and comprises a battery pairing component (32), a usage battery state acquisition component (33), and a charging current determination component (37). The battery pairing component (32) is configured to set a charging objective battery (10) to be paired with a usage battery (10). The usage battery state acquisition component (33) is configured to acquire information about the state of the usage battery (10). The charging current determination component (37) is configured to determine the charging current of the charging
(Continued)

objective battery (10) on the basis of information about the state acquired by the usage battery state acquisition component (33).

9 Claims, 9 Drawing Sheets

(51) Int. Cl.
| | |
|---|---|
| *G01R 31/3828* | (2019.01) |
| *H02J 7/00* | (2006.01) |
| *B60L 58/13* | (2019.01) |
| *B60L 3/12* | (2006.01) |
| *B60L 53/80* | (2019.01) |
| *B60L 58/12* | (2019.01) |
| *B60L 53/00* | (2019.01) |
| *G01R 31/00* | (2006.01) |
| *H01M 10/42* | (2006.01) |

(52) U.S. Cl.
CPC ............ *B60L 58/12* (2019.02); *B60L 58/13* (2019.02); *G01R 31/006* (2013.01); *G01R 31/3828* (2019.01); *H02J 7/00* (2013.01); *H02J 7/0021* (2013.01); *H02J 7/0027* (2013.01); *H02J 7/00036* (2020.01); *B60L 2200/12* (2013.01); *B60L 2240/549* (2013.01); *B60L 2260/54* (2013.01); *B60L 2260/58* (2013.01); *H01M 10/4257* (2013.01); *H02J 7/00034* (2020.01); *Y02T 10/7005* (2013.01)

(56) References Cited

U.S. PATENT DOCUMENTS

| | | | |
|---|---|---|---|
| 2011/0175576 A1 | 7/2011 | Uesaka et al. | |
| 2011/0215764 A1* | 9/2011 | Takahashi | H02J 7/00 320/134 |
| 2012/0019196 A1* | 1/2012 | Fung | B60L 53/665 320/107 |
| 2012/0126744 A1 | 5/2012 | Kuroda et al. | |
| 2013/0090797 A1 | 4/2013 | Izumi | |
| 2013/0249483 A1 | 9/2013 | Iida | |
| 2013/0285608 A1 | 10/2013 | Jikihara | |
| 2013/0314054 A1* | 11/2013 | Bergqvist | H02J 7/0088 320/162 |
| 2015/0048802 A1* | 2/2015 | Tani | B60L 15/20 320/149 |
| 2015/0158393 A1* | 6/2015 | Kawano | B60L 53/65 320/109 |
| 2015/0165918 A1* | 6/2015 | Shizuno | H02J 7/0027 320/109 |
| 2015/0357837 A1* | 12/2015 | Takai | H02J 7/0027 320/107 |

FOREIGN PATENT DOCUMENTS

| | | |
|---|---|---|
| JP | H8-130833 A | 5/1996 |
| JP | 2003-344096 A | 12/2003 |
| JP | 2011-142704 A | 7/2011 |
| JP | 2011-151891 A | 8/2011 |
| WO | 2010084599 A1 | 7/2010 |
| WO | 2011/161780 A1 | 12/2011 |
| WO | 2014/006953 A1 | 1/2014 |
| WO | 2015001930 A1 | 1/2015 |

OTHER PUBLICATIONS

An English translation of the International Search Report of PCT/JP2016/082664 dated Jan. 17, 2017.

An English translation of the Written Opinion of PCT/JP2016/082664 dated Jan. 17, 2017.

The Japanese office action letter dated Oct. 29, 2019 in a counterpart Japanese patent application.

* cited by examiner

| Pair | ID | State | SOC | Capacity |
|---|---|---|---|---|
| 1 | A-1 | in use | 40% | 1000wh |
| | A-2 | in charge | 60% | 1000wh |
| 2 | B-1 | in use | 80% | 1000wh |
| | B-2 | in charge | 30% | 1000wh |
| 3 | C-1 | in use | 70% | 1000wh |
| | C-2 | in charge | 30% | 1000wh |

Table 1: battery table

FIG. 3

BATTERY CHARGING DEVICE, BATTERY CHARGING SYSTEM, AND BATTERY CHARGING METHOD

FIELD

The present invention relates to a battery charging device, a battery charging system, and a battery charging method.

BACKGROUND ART

A conventional charging system has been proposed in which a plurality of battery packs are readied for a single electric work vehicle, and when the remaining charge of the installed battery packs runs out, the battery packs are replaced with previously charged battery packs (see Patent Literature 1, for example).

With the charging system disclosed in Patent Literature 1, the remaining charge of the batteries of a plurality of work vehicles is collected, and the expected power consumption until a specific length of time has elapsed is calculated. An index value for determining the battery replacement priority order for the plurality of work vehicles is calculated from the difference between the remaining charge and the expected power consumption, and a return command is issued to work vehicles on the basis of the index value and the allowable charge that can be accepted by the batteries.

CITATION LIST

Patent Literature

Patent Literature 1: JP-A 2011-142704

SUMMARY

However, the following problems may be encountered with the system disclosed in Patent Literature 1.

With the above-mentioned charging system, the charging speed of the batteries being charged is not controlled, and the batteries are charged as quickly as possible so as to be able to accommodate the replacement of batteries. However, if there is still some capacity left in the batteries of a work vehicle, even though the batteries being charged have reached a fully charged state, the work vehicle may not come in for battery replacement right away, and the batteries may be left for an extended period in a state of being near full charge. When batteries thus are left in a state of being near full charge for a long time, the batteries tend to deteriorate.

It is an object of the present invention to provide a battery charging device, a battery charging system, and a battery charging method with which the length of time batteries are left near full charge can be reduced.

Solution to Problem

The battery charging device pertaining to the first invention is a battery charging device for charging a battery used in a power consumption element, said device comprising a battery pairing component, a usage battery state acquisition component, and a charging current determination component. The battery pairing component sets a charging objective battery to be paired with a usage battery. The usage battery state acquisition component acquires the usage state of the usage battery. The charging current determination component determines the charging current of the charging objective battery on the basis of the usage state acquired by the usage battery state acquisition component.

Thus acquiring the usage state of the usage battery allows the charging capacity of a rechargeable battery to be increased as the remaining capacity of the usage battery decreases, for example. Accordingly, the charging battery can be brought to the target charge amount (such as fully charged) so as to match the timing at which the remaining capacity of the battery being used decreases and the battery is exchanged. Therefore, batteries will be left standing for less time in a state of being near the targeted charge amount (such as fully charged). Also, since no extra charging current has to be inputted to maintain the target charging power amount, energy consumption can be reduced.

Also, when the user arrives at the charging device, the charge of the battery will have reached the target charging power amount, so the user does not have to wait for charging to be completed, which makes the experience more convenient for the user.

Also, since the charging current is determined on the basis of the usage state, control can be performed so as to charge the charging battery as the remaining capacity of the usage battery decreases, for example, and the usage battery and the charging battery can be controlled more simply than in the past.

The battery charging device pertaining to the second invention is the battery charging device pertaining to the first invention, further comprising a charging battery state acquisition component. The charging battery state acquisition component acquires the charging state of the paired charging objective battery. The charging current determination component determines the charging current of the charging objective battery on the basis of the usage state acquired by the usage battery state acquisition component and the charging state acquired by the charging battery state acquisition component.

Thus acquiring the usage state of the battery being used and the charging state of the battery being charged makes it possible to bring the charging battery to the targeted charge amount (such as fully charged) so as to match the timing of exchanging a usage battery for a charging battery. Therefore, batteries will be left standing for less time in a state of being near the targeted charge amount (such as fully charged).

The battery charging device pertaining to the third invention is the battery charging device pertaining to the first invention, further comprising a target charging power amount acquisition component and a target return capacity acquisition component. The target charging power amount acquisition component acquires the target charging power amount of the charging objective battery. The target return capacity acquisition component acquires the target return capacity of the usage battery. The charging current determination component determines the charging current so that when the remaining capacity of the usage battery reaches the target return capacity, the charge amount of the charging objective battery reaches the target charging power amount.

Thus determining the charging current so that the charge of the charging objective battery reaches the target charging power amount when the usage battery reaches the target return capacity, so batteries that are near the target charging power amount will be left standing for less time.

The timing of reaching the target return capacity and the timing of reaching the target charging power amount do not have to coincide exactly, as long as they are within a permissible range.

The battery charging device pertaining to the fourth invention is the battery charging device pertaining to the first invention, wherein the charging current determination component has a decrease amount calculator. The decrease amount calculator calculates the amount of decrease in the usage battery over a specific length of time on the basis of the usage state acquired by the usage battery state acquisition component. The charging current determination component determines the charging current on the basis of the amount of decrease over a specific length of time calculated by the decrease amount calculator.

Since the charge of the charging objective battery is thus controlled on the basis of the amount of decrease in the usage battery for a specific length of time, control of the usage battery and the charging battery can be carried out very simply.

The battery charging device pertaining to the fifth invention is the battery charging device pertaining to the third invention, further comprising a charging battery state acquisition component. The charging battery state acquisition component acquires the charging state of the charging objective battery set in the pair. The charging current determination component has a charge/discharge ratio calculator, a decrease amount calculator, and a charge amount calculator. The charging battery state acquisition component acquires the initial capacity of the charging objective battery. The usage battery state acquisition component acquires the initial capacity of the usage battery. The charge/discharge ratio calculator calculates a charge/discharge ratio that is the ratio of the difference between the initial capacity and the target charging power amount of the charging objective battery to the difference between the initial capacity and the target return capacity of the usage battery. The decrease amount calculator calculates the amount of decrease in the usage battery over a specific length of time on the basis of the usage state acquired by the usage battery state acquisition component. The charge amount calculator calculates the charge amount over a specific length of time by finding the product of the decrease amount and the charge/discharge ratio. The charging current determination component determines the charging current on the basis of the calculated charge amount.

Consequently, the charging current can be determined so that the charge of the charging objective battery will reach the target charging power amount when the usage battery reaches the target return capacity.

The battery charging device pertaining to the sixth invention is the battery charging device pertaining to the second invention, further comprising a target charging power amount acquisition component and a notification component. The target charging power amount acquisition component acquires the target charging power amount of the charging objective battery. The notification component notifies the user of the power consumption element that the charge of the charging objective battery has reached the target charging power amount.

Consequently, the user of the power consumption element can confirm that the charge of the charging objective battery has reached the target charging power amount.

The battery charging device pertaining to the seventh invention is the battery charging device pertaining to the first invention, wherein the power consumption element is an electric motorcycle, an electric bicycle, an electrically assisted bicycle, an electric automobile, an autonomous conveyance vehicle, or an electric power tool.

Here, a vehicle such as an electric motorcycle, an electric bicycle, an electrically assisted bicycle, an electric automobile, or an autonomous conveyance vehicle is used as the power consumption element. An autonomous conveyance vehicle is, for example, an AGV (automatic guided vehicle), which are used in warehouses and so forth. The electric power consumption element here also encompasses an electric power tool such as an electric drill.

The battery charging system pertaining to the eighth invention is a battery charging system for charging a battery used in a power consumption element, said system comprising a battery pairing component, a usage battery state transmitter, a usage battery state acquisition component, and a charging current determination component. The battery pairing component sets a charging objective battery to be paired with a usage battery. The usage battery state transmitter transmits the usage state of the usage battery. The usage battery state acquisition component acquires the usage state transmitted by the usage battery state transmitter. The charging current determination component determines the charging current of the charging objective battery on the basis of the usage state acquired by the usage battery state acquisition component.

Thus acquiring the usage state of the battery being used makes it possible to increase the charge capacity of a rechargeable battery as the remaining capacity of the usage battery decreases, for example. Accordingly, the charging battery can be brought to the target charge amount (such as fully charged) so as to match the timing at which the remaining capacity of the battery being used decreases and the battery is exchanged. Therefore, batteries will be left standing for less time in a state of being near the targeted charge amount (such as fully charged). Also, since no extra charging current has to be inputted to maintain the target charging power amount, energy consumption can be reduced.

Also, when the user arrives at the charging device, the charge of the battery will have reached the target charging power amount, so that the user does not have to wait for the charging to be completed, which makes the experience more convenient for the user.

Also, since the charging current is determined on the basis of the usage state, control can be performed so as to charge the charging battery as the remaining capacity of the usage battery decreases, for example, and the usage battery and the charging battery can be controlled more simply than in the past.

The battery charging method pertaining to the ninth invention is a battery charging method for charging a battery used in a power consumption element, said method comprising a battery pairing step, a usage battery state acquisition step, and a charging current determination step. The battery pairing step involves setting a charging objective battery to be paired with a usage battery. The usage battery state acquisition step involves acquiring the usage state of the usage battery. The charging current determination step involves determining the charging current of the charging objective battery on the basis of the usage state acquired by the usage battery state acquisition step.

Therefore, batteries will be left standing for less time in a state of being near the targeted charge amount (such as fully charged). Also, since no extra charging current has to be inputted to maintain the target charging power amount, energy consumption can be reduced.

Also, when the user arrives at the charging device, the charge of the battery will have reached the target charging power amount, so the user does not have to wait for charging to be completed, which makes the experience more convenient for the user.

Also, since the charging current is determined on the basis of the usage state, control can be performed so as to charge the charging battery as the remaining capacity of the usage battery decreases, for example, and the usage battery and the charging battery can be controlled more simply than in the past.

Effects

The present invention provides a battery charging device, a battery charging system, and a battery charging method with which the length of time batteries are left near full charge can be reduced.

BRIEF DESCRIPTION OF THE DRAWINGS

FIG. 3 is a table showing examples of pairings in the battery charging device in FIG. 2;

DETAILED DESCRIPTION

The battery charging device, battery charging system, and battery charging method pertaining to an embodiment of the present invention will now be described through reference to the drawings.

Embodiment

1. Configuration

Figure 1:
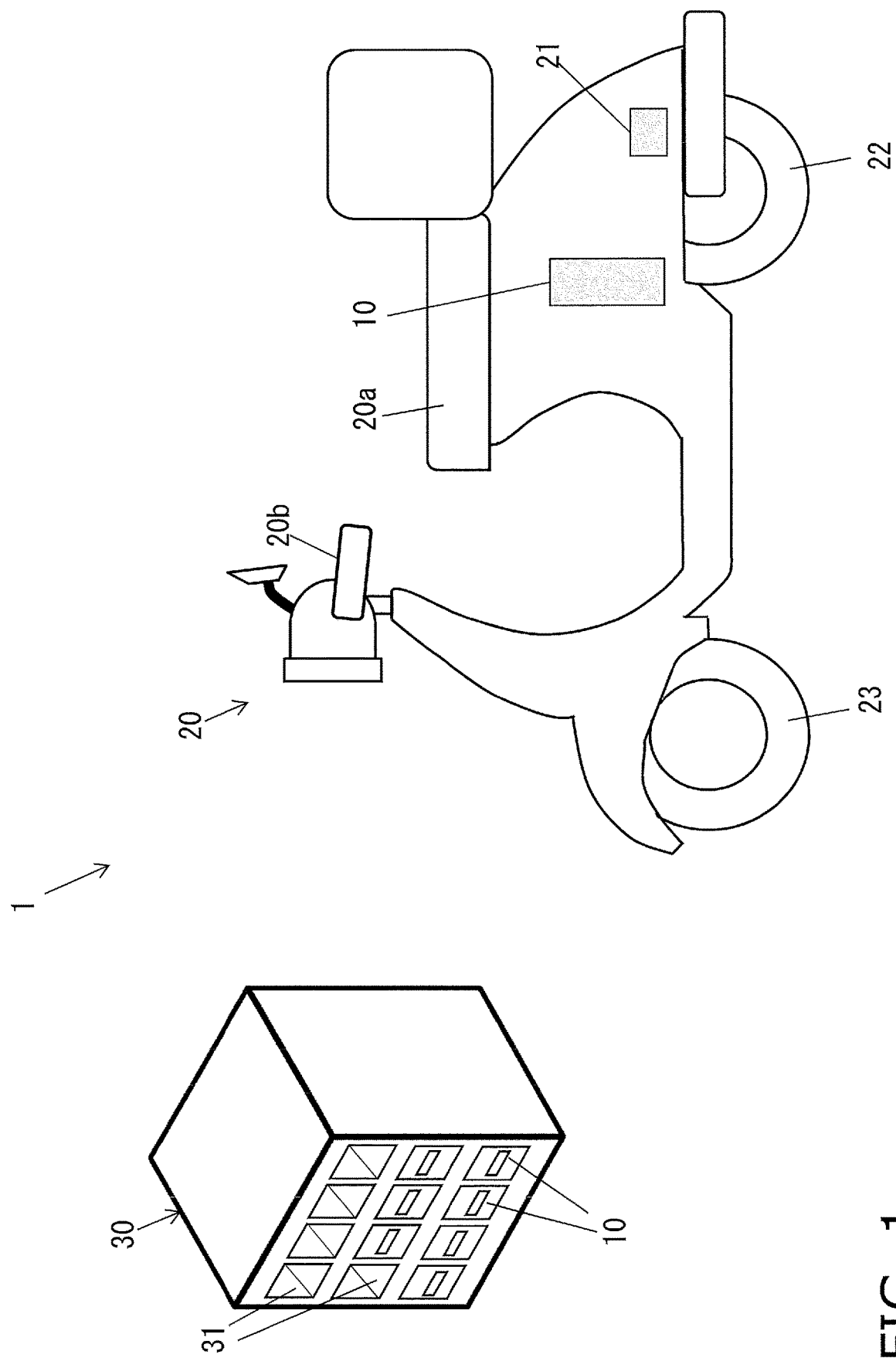
FIG. 1 is a diagram showing a battery charging system in an embodiment of the present invention.
Figure 2:
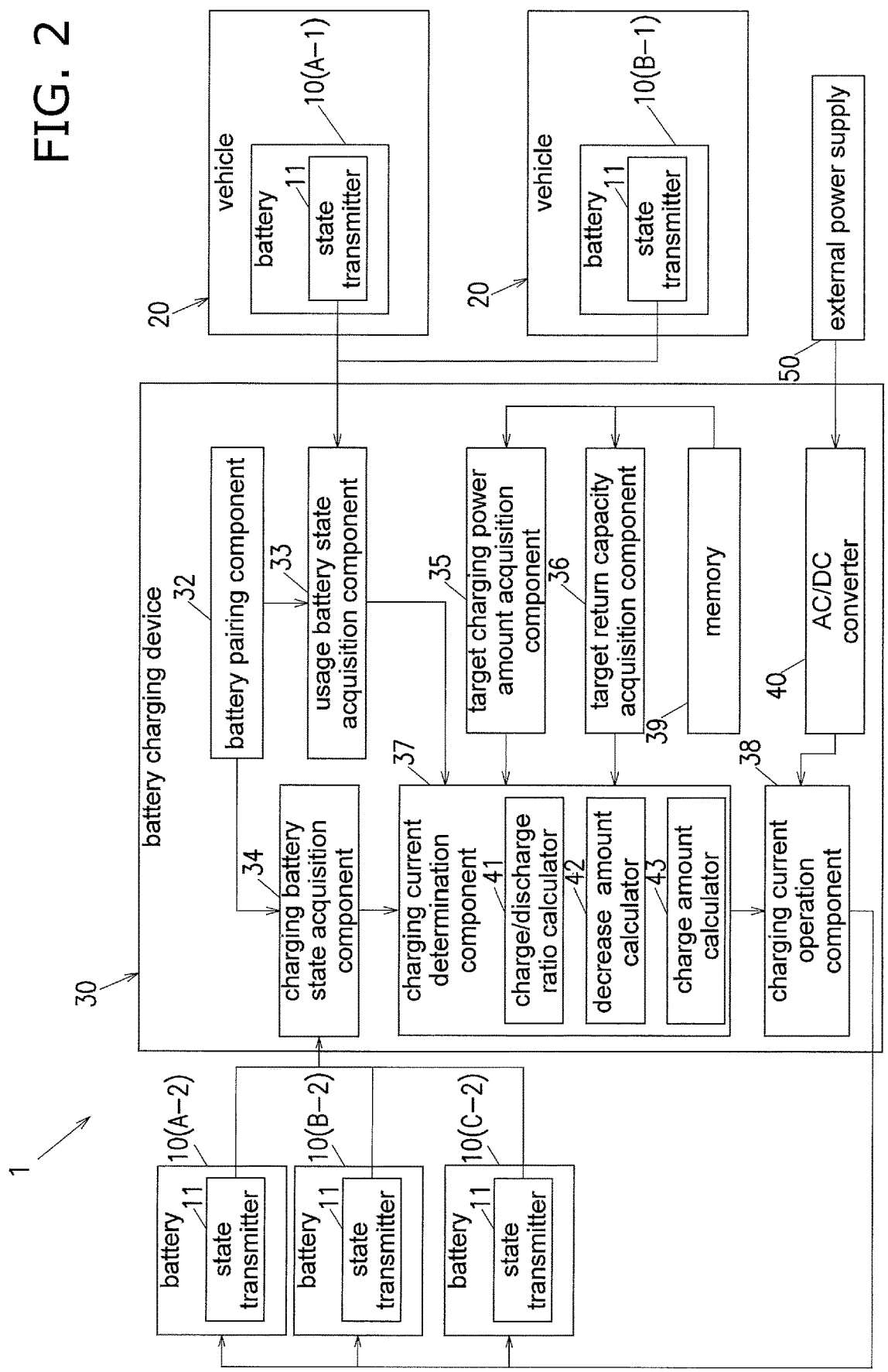
FIG. 2 is a block diagram showing the configuration of the battery charging system in FIG. 1.

The battery charging system 1 in this embodiment is a system that charges batteries 10 in order to exchange the battery 10 mounted in a vehicle 20 at a battery charging device 30. As shown in FIGS. 1 and 2, the battery charging system 1 of the present embodiment comprises the battery charging device 30 and a plurality of batteries 10.

1-1. Vehicle 20

First, the vehicle 20 in which the battery 10 is installed will be described. The vehicle 20 is propelled when supplied with power from a single battery 10 installed in a space below a seat 20a to a motor 21, and the rear wheel (drive wheel) 22 is rotationally driven. The front wheel 23 is a steered wheel provided between the front part of the vehicle 20 and the road surface, and the travel direction can be varied by changing the orientation in conjunction with the orientation of a handle bar 20b.

The vehicle 20 can make use of a so-called battery swap, in which the battery 10 whose remaining capacity has been reduced by travel, natural discharge, or the like is exchanged for a charged battery 10 at a specific battery charging device 30.

1-2. Battery 10

In order to supply power to the vehicle 20, one battery 10 is installed in the vehicle 20 in a manner that allows it to be replaced.

As shown in FIG. 2, the battery 10 has a state transmitter 11 that transmits state information about the battery 10 to the battery charging device 30. The state transmitter 11 transmits state information including the remaining capacity (state of charge (SOC)) of the battery 10, the charging and discharging current, the voltage, the temperature, the equipment used, the battery ID, the model, and so forth to the battery charging device 30. In a state in which the battery 10 is being charged by the battery charging device 30, the state transmitter 11 communicates with the battery charging device 30 via a wired or wireless communication chip. In a state where the battery 10 is installed in the vehicle 20, state information is transmitted to the battery charging device 30 by a wireless communication chip installed in the state transmitter 11. For example, when the vehicle 20 is for indoor use, WiFi, Wi-SUN, Zigbee (registered trademark), or the like can be used for wireless communication.

1-3. Battery Charging Device 30

The battery charging device 30 charges the battery 10 used in the vehicle 20. As shown in FIG. 1, the battery charging device 30 has a plurality of rechargeable battery holes 31 into which batteries 10 are inserted. The batteries 10 are housed in the rechargeable battery holes 31. The batteries 10 are charged while housed in these rechargeable battery holes 31.

As shown in FIG. 2, the battery charging device 30 has a battery pairing component 32, a usage battery state acquisition component 33, a charging battery state acquisition component 34, a target charging power amount acquisition component 35, a target return capacity acquisition component 36, a charging current determination component 37, a charging current operation component 38, a memory 39, and an AC/DC converter 40.

The battery pairing component 32 pairs up the battery 10 used in the vehicle 20 with a battery 10 being charged by the battery charging device 30. Here, as shown in FIG. 2, the batteries 10 installed in two vehicles 20 shall be termed 10 (A-1) and 10 (B-1), and three batteries 10 being charged by the battery charging device 30 shall be termed 10 (A-2), 10 (B-2), and 10 (C-2). For example, the battery pairing component 32 pairs the battery 10 (A-1) with the battery 10 (A-2), and pairs the battery 10 (B-1) with the battery 10 (B-2). Thus, when there are a plurality of batteries 10, the battery pairing component 32 pairs up the batteries 10 being used in the vehicles 20 with batteries 10 being charged by the battery charging device 30. These pairs may be fixed in advance or may be actively changed every time a battery 10 is exchanged.

The usage battery state acquisition component 33 acquires state information about the batteries 10 (the batteries 10 (A-1) and 10 (B-1)) installed and used in the vehicle 20. As mentioned above, the usage battery state acquisition component 33 and the status transmitter 11 of the battery 10 installed in the vehicle 20 communicate wirelessly. The state information that is acquired includes the remaining capacity (state of charge (SOC)), the charging and discharging current, the voltage, the temperature, the equipment used, the battery ID, the model, and so forth.

The charging battery state acquisition component 34 acquires state information about the batteries 10 paired up with the batteries 10 to be used, from among the batteries 10 being charged in the battery charging device 30. For example, when the battery 10 (A-2) and the battery 10 (A-1) are paired, the charging battery state acquisition component 34 receives the state information for the battery 10 (A-2) from the state transmitter 11 of the battery 10 (A-2). When the battery 10 (B-2) is paired up with the battery 10 (B-1), the charging battery state acquisition component 34 also acquires state information for the battery 10 (B-2).

The targeted charging power amount acquisition component 35 acquires the target charge amount for the batteries 10 that are paired up with the batteries 10 used in the vehicles 20. The targeted charge amount is set to 80% of the total capacity to which the batteries 10 can be charged, for example. This will be described below through reference to FIG. 4, but it is because the target charging power amount is set within the CC charging range in order to make it possible to control the charging speed by varying the charging current. The target charging power amount of 80%, for example, is stored in the memory 39, and the target charging power amount acquisition component 35 reads the value from the memory 39. This is not the only option, and instead the user may set a value and the target charging power amount acquisition component 35 may acquire this value.

The target return capacity acquisition component 36 acquires the targeted remaining capacity of the batteries 10 used in the vehicles 20. Here, the targeted remaining capacity is set to 20% of the total chargeable capacity, for example. The target return capacity of 20%, for example, is stored in the memory 39, and the target return capacity acquisition component 36 reads this value. This is not the only option, and instead the user may set a value, and the target return capacity acquisition component 36 may acquire this value. Furthermore, the user of the vehicle 20 may set the value in the vehicle 20, and the target return capacity acquisition component 36 may acquire that value through communication.

The charging current determination component 37 determines the charging current on the basis of state information about the batteries 10 used in the vehicles 20, state information about the batteries 10 being charged, the target charging power amount, and the target return capacity. For example, as shown in FIG. 3, the charging current determination component 37 has a table containing data such as the SOC and capacity for each pair of a battery 10 that is in use and a battery 10 that is being charged, and this data is updated as needed. When the target charging power amount and the target returning capacity are set for each pair, the target charging power amount and the target return capacity may be added to the table shown in FIG. 3. In FIG. 3, the battery 10 with the ID number A-1 and the battery 10 with the ID number A-2 are paired, the battery 10 with the ID number B-1 and the battery 10 with the ID number B-2 are paired, and the battery 10 with the ID number C-1 and the battery 10 with the ID number C-2 are paired. The battery 10 (C-1) is not depicted in FIG. 2. Also, when the pairs are actively determined, the battery 10 with the ID number A-1 and the battery 10 with the ID number C-2 may be paired, for example.

The charging current determination component 37 has a charge/discharge ratio calculator 41, a decrease amount calculator 42, and a charge amount calculator 43.

The charge/discharge ratio calculator 41 calculates the charge/discharge ratio using the following Equations 1 to 3.

$$\text{(target charging power amount−capacity at return)}=\text{required charge amount} \quad \text{Equation 1:}$$

$$\text{(target return capacity−capacity at exchange)}=\text{assumed discharge amount} \quad \text{Equation 2:}$$

$$\text{required charge amount÷assumed discharge amount}=\text{charge/discharge ratio} \quad \text{Equation 3:}$$

The capacity at return is the capacity at the time of return of a battery 10 being charged in the battery charging device 30, which could also be called the initial capacity of a battery 10 being charged, and is acquired by the charging battery state acquisition component 34.

The capacity at exchange is the capacity at the time of exchange of a battery 10 used in a vehicle 20, which could also be called the initial capacity of a battery 10 being used, and is acquired by the usage battery state acquisition component 33.

The decrease amount calculator 42 calculates the amount of decrease in the capacity at specific time intervals from the state information at each specific length of time acquired by the charging battery state acquisition component 34.

The charge amount calculator 43 calculates the charge amount over a specific length of time by finding the product of the decrease amount and the charge/discharge ratio.

The charging current determination component 37 determines the charging current so as to attain the charge amount calculated by the charge amount calculator 43.

Figure 4:
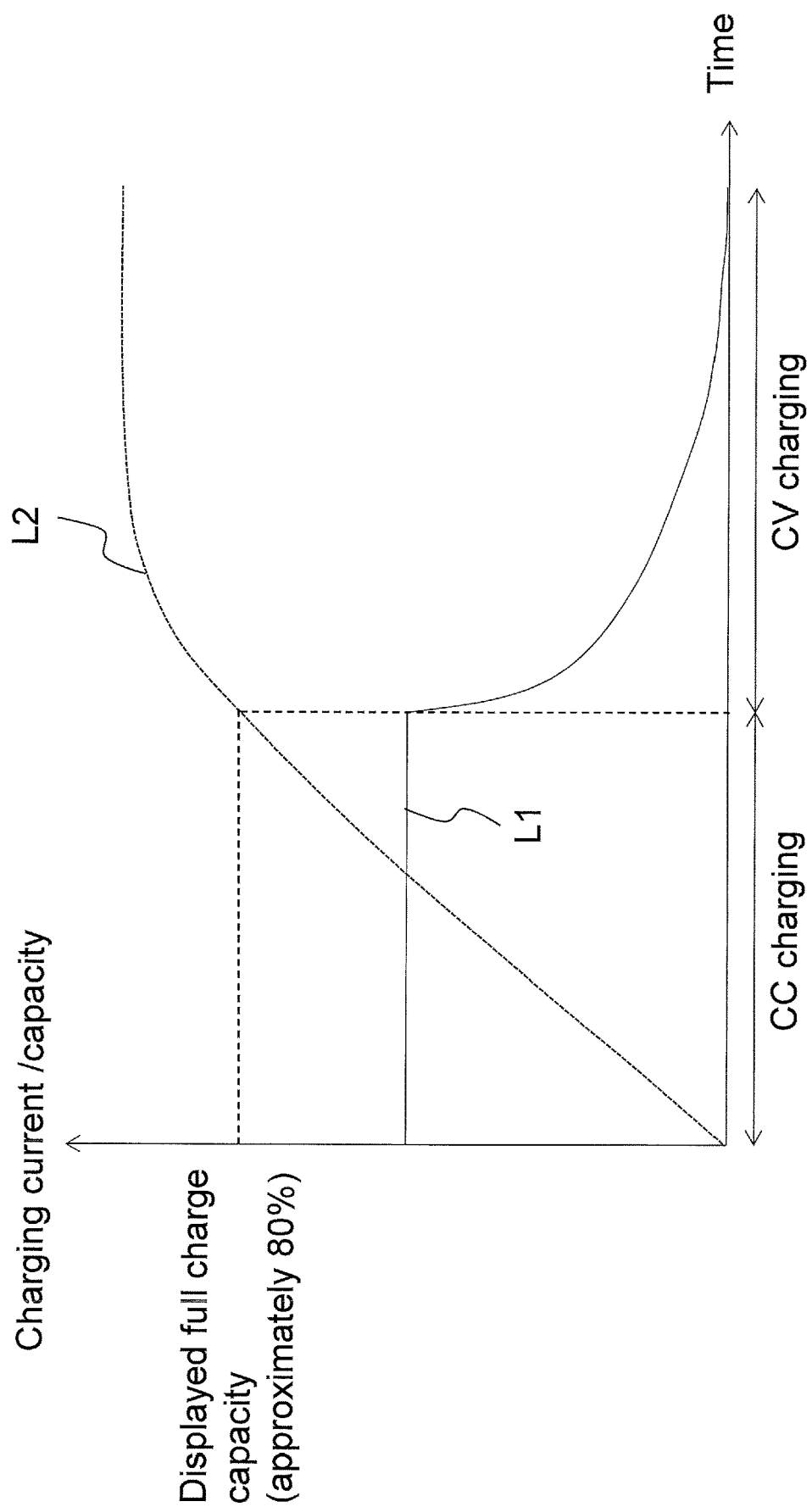
FIG. 4 is a diagram illustrating the charging of a battery in the battery charging device in FIG. 2.
Figure 5:
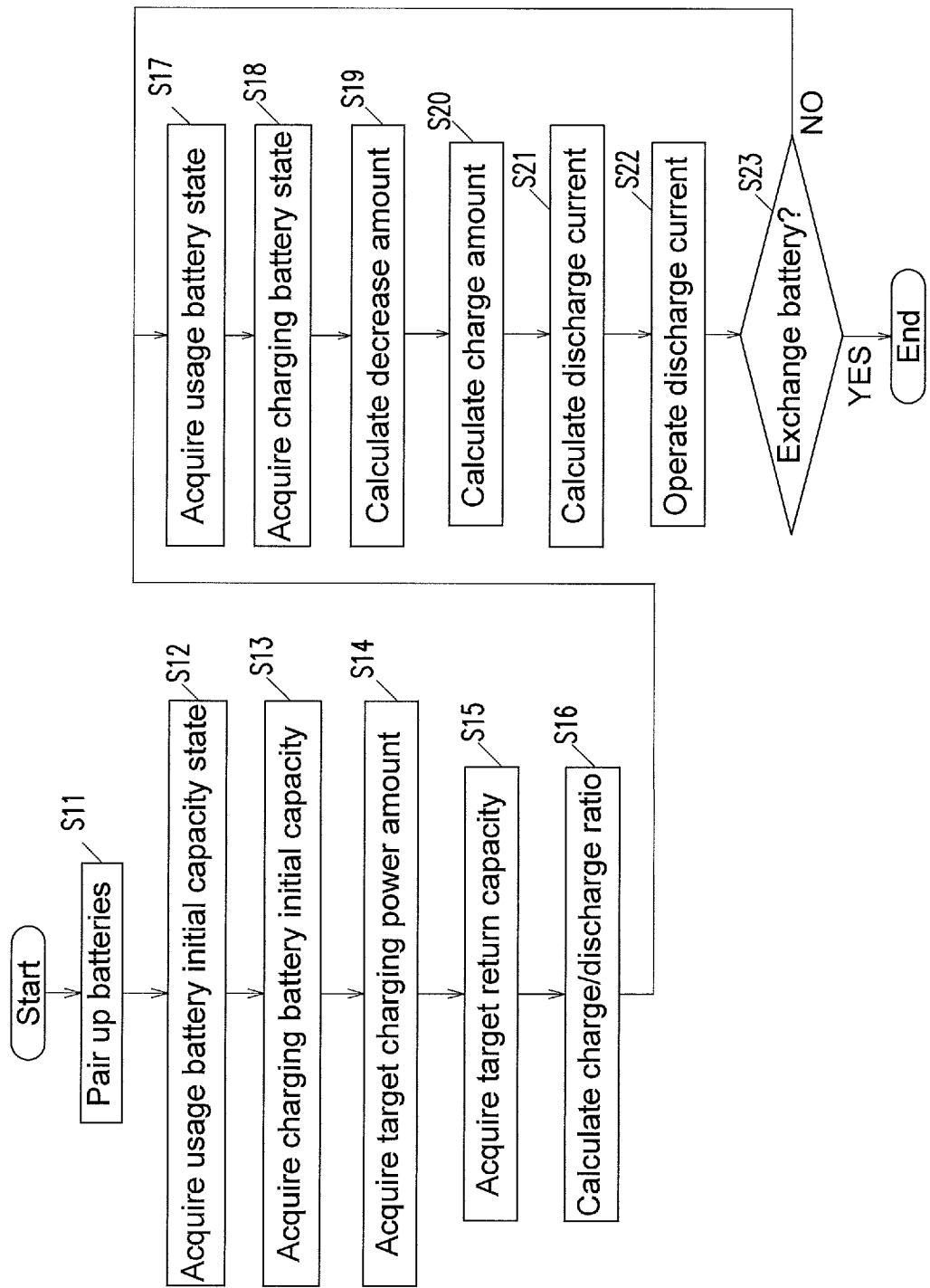
FIG. 5 is a flowchart of the operation of the battery charging device in FIG. 2.

Here, as shown in FIG. 4, the battery charging device 30 in this embodiment performs CV (constant voltage) charging after performing CC (constant current) charging. In FIG. 4, the solid line L1 indicates a change in current, and the dotted line L2 indicates a change in the capacity of the battery 10.

The battery charging device 30 can control the charging duration by varying the charging current during the CC charging period. The CC charging period is the period up to about 80% of the chargeable total capacity. Therefore, in the period up to about 80% of the total chargeable capacity, the charging duration can be made shortened by increasing the charging current, and the charging duration can be lengthened by decreasing the charging current.

The charging current operation component 38 has a variable current device and controls the charging current to the battery 10 so as to attain the charging current determined by the charging current determination component 37.

The memory 39 stores the targeted remaining charge (target return capacity) of the batteries 10 used in the vehicles 20, and the targeted charge amount (target charging power amount) of the batteries 10 paired up with the batteries 10 used in the vehicles 20.

The AC/DC converter 40 is connected to an external power supply 50, converts AC to DC, and supplies charging current to the batteries 10 via the charging current operation component 38.

2. Operation

Next, the operation of the battery charging device pertaining to the present invention will be described, and an example of the battery charging method of the present invention will be given at the same time.

In step S11, the battery pairing component 32 sets the batteries 10 to be paired with the batteries 10 used in the vehicles 20, from among the batteries 10 being charged in the battery charging device 30. For example, as shown in FIGS. 2 and 3, let us assume that the battery 10 (B-2) being charged by the battery charging device 30 is paired with the battery 10 (B-1) used in the vehicle 20.

Figure 6:
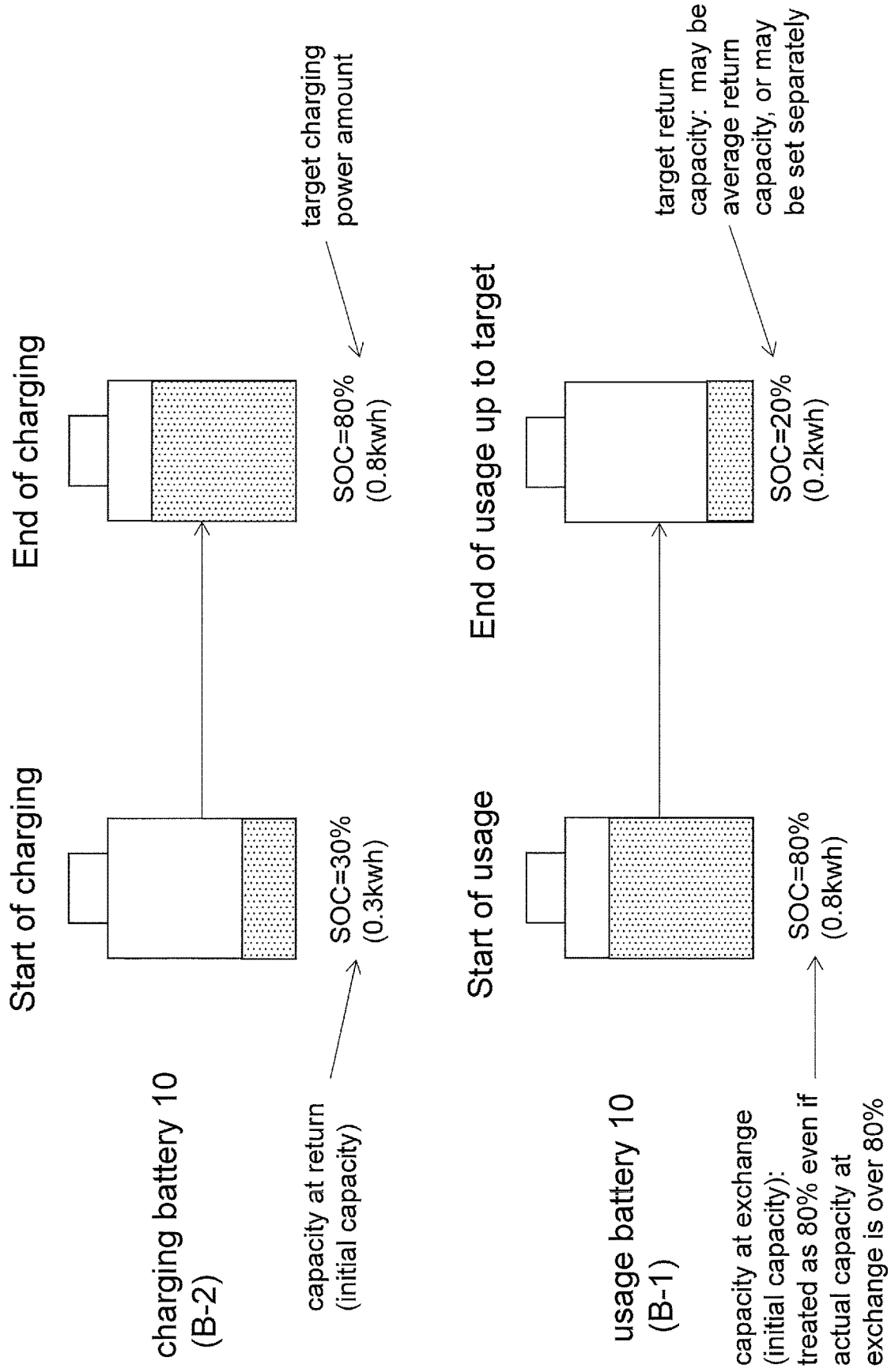
FIG. 6 is a diagram showing an example of the flow in FIG. 5.

Next, in step S12, the usage battery state acquisition component 33 acquires the initial capacity of the batteries 10 used in the vehicles 20 from the state transmitter 11. Here, let us assume that the initial capacity of the battery 10 (B-1) that is in use is 80% (0.8 kwh), as shown in FIG. 6, for example. In this embodiment, as shown in FIG. 4, a battery 10 being used is fully charged at the charge capacity (about 80%) charged by CC charging, so the initial capacity may sometimes be over 80%, but for the purposes of calculation it will be treated as 80%.

Next, in step S13, the charging battery state acquisition component 34 acquires the initial capacity of the paired batteries 10 from the state transmitter 11. Because a charged battery is at full charge, the initial capacity of above-mentioned the battery 10 being used is 80%, but since the initial capacity of the batteries 10 being charged depends on the state at the time of return, there is variance in the initial capacity. Here, the initial capacity of the battery 10 (B-2) paired up with the battery 10 (B-1) is assumed to be 30% (0.3 kwh), as shown in FIG. 6, for example.

Next, in step S14, the target charging power amount acquisition component 35 acquires the target charging power amount from the memory 39. As shown in FIG. 6, the target charging power amount is set to 80% (0.8 kwh), for example.

Next, in step S15, the target return capacity acquisition component 36 acquires the target return capacity from the memory 39. As shown in FIG. 6, the target return capacity is set to 20% (0.2 kwh), for example.

Next, in step S16, the charge/discharge ratio calculator 41 calculates the charge/discharge ratio using Equations 1 to 3 given above. In the example in FIG. 6, the required amount of power is calculated to be 500 wh (=800 wh−300 wh) from Equation 1. The assumed discharge amount is calculated to be 600 wh (=800 wh−200 wh) from Equation 2. The charge/discharge ratio is calculated to be 0.83 (≈500 wh/600 wh) from Equation 3).

Next, in step S17, the usage battery state acquisition component 33 acquires state information about the batteries 10 used in the vehicles 20 from the state transmitter 11 at specific time intervals. The specific time can be set to one minute, for example.

Next, in step S18, the charging battery state acquisition component 34 acquires state information about the batteries 10 set to be paired up during charging in the battery charging device 30 from the state sending component 11 at specific time intervals.

Next, in step S19, the decrease amount calculator 42 calculates the decrease in the capacity of the batteries 10 over a specific length of time. That is, the decrease amount calculator 42 can calculate the decrease in capacity by comparing the capacity a specific length of time earlier (such as 1 minute before) with the current capacity.

Next, in step S20, the charge amount calculator 43 calculates the charge amount by multiplying the decrease in capacity by the charge/discharge ratio (0.83 in the above example). That is, the charge amount calculator 43 calculates the charge amount to be increased over a specific length of time. For example, if it is assumed that the battery 10 (B-1) that is being used is decreases in capacity by 5 wh per minute, the battery 10 (B-2) is increased by 4.15 wh (=5× 0.83) in one minute.

Next, in step S21, the charging current determination component 37 determines the charging current that will accomplish the charge amount calculated by the charge amount calculator 43. As described above, since the charging current is determined within the CC charging range, the current value and the charging capacity are substantially proportional.

Next, in step S22, the charging current operation component 38 controls the charging current by operating the variable current device so as to realize the determined charging current.

Then, in the step S23, the above-mentioned steps S17 to S22 are repeated until it is detected that the battery charging device 30 has exchanged the battery 10 (B-1) and the battery 10 (B-2). That is, until the batteries 10 are exchanged, state information for the battery 10 (B-1) being used is acquired at specific time intervals (such as one minute), and the charging speed of the battery 10 (B-2) can be adjusted in minute units to match the capacity decrease of the battery 10 (B-1) in minute units.

Therefore, when the battery 10 (B-1) being used reaches the target return capacity, the paired battery 10 (B-2) that is being charged reaches the target charging power amount. Here, the timing at which the target return capacity is reached and the timing at which the target charging power amount is reached may not exactly coincide because the charging speed is adjusted with a delay of one minute with respect to the decreased capacity, as long as they are within the permissible range. The timing discrepancy can be reduced by shortening the interval for acquiring the state information to minute units, for example.

3. Features, Etc.

3-1

The battery charging device 30 in this embodiment is a battery charging device that charges a battery 10 used in vehicle 20 (an example of a power consumption element), and comprises the battery pairing component 32, the usage battery state acquisition component 33, and the charging current determination component 37. The battery pairing component 32 sets the charging objective battery 10 to be paired with the usage battery 10. The usage battery state acquisition component 33 acquires state information (an example of the usage state) about the usage battery 10. The charging current determination component 37 determines the charging current of the charging objective battery 10 on the basis of the state information acquired by the usage battery state acquisition component 33.

Thus acquiring state information (an example of the usage state) about the usage battery 10 makes it possible to increase the charge capacity of the charging battery as the remaining capacity of the usage battery decreases, for example. Accordingly, the charging battery can be brought to the target charge amount (such as fully charged) so as to match the timing at which the remaining capacity of the battery being used decreases and the battery is exchanged. Therefore, batteries will be left standing for less time in a state of being near the targeted charge amount (such as fully charged). Also, since no extra charging current has to be inputted to maintain the target charging power amount, energy consumption can be reduced.

Also, when the user arrives at the charging device 30, the charge of the battery will have reached the target charging power amount, so the user does not have to wait for charging to be completed, which makes the experience more convenient for the user.

Also, since the charging current is determined on the basis of the state information of the usage battery 10, control can be performed so as to charge the charging objective battery 10 as the remaining capacity of the usage battery decreases, for example, and the usage battery and the charging battery can be controlled more simply than in the past.

3-2

The battery charging device 30 in this embodiment further comprises the charging battery state acquisition component 34. The charging battery state acquisition component 34 acquires state information (an example of the charging state) of the paired charging objective battery 10. The charging current determination component 37 determines the charging current of the charging objective battery 10 on the basis of the state information (an example of the usage state) acquired by the usage battery state acquisition component 33 and the state information (an example of the charge state) acquired by the charging battery state acquisition component 34.

Thus acquiring state information about the batteries 10 being used and state information about the batteries 10 being charged makes it possible to bring the charging batteries 10 to the targeted charge amount (such as full charge) so as to match the timing at which a usage battery 10 is exchanged with a charging objective battery 10. Therefore, batteries will be left standing for less time in a state of being near the targeted charge amount (such as fully charged).

3-3

The battery charging device 30 in this embodiment further comprises the target charging power amount acquisition component 35 and the target return capacity acquisition component 36. The target charging power amount acquisition component 35 acquires the target charging power amount of the charging objective battery 10. The target return capacity acquisition component 36 acquires the target return capacity of the usage battery 10. The charging current determination component 37 determines the charging current so that the remaining capacity of the charging objective battery will reach the target charging power amount when the remaining capacity of the usage battery 10 reaches the target return capacity.

Thus determining the charging current so that the charge amount of the charging objective battery 10 reaches the target charging power amount when the usage battery 10 reaches the target return capacity reduces the amount of time batteries 10 that have reached the target charging power amount are left standing.

The timing of reaching the target return capacity and the timing of reaching the target charging power amount do not have to coincide exactly, as long as they are within a permissible range.

3-4

With the battery charging device 30 in this embodiment, the charging current determination component 37 has the decrease amount calculator 42. The decrease amount calculator 42 calculates the amount of decrease in the usage battery 10 over a specific length of time on the basis of the usage state acquired by the usage battery state acquisition component 33. The charging current determination component 37 determines the charging current on the basis of the amount of decrease over the specific length of time calculated by the decrease amount calculator 42.

Since the amount of charge of the charging objective battery 10 is thus controlled on the basis of the amount of decrease in the usage battery 10 over a specific length of time, it is a simple matter to control the usage battery 10 and the charging objective battery 10.

3-5

With the battery charging device 30 in this embodiment, the charging current determination component 37 has the charge/discharge ratio calculator 41, the decrease amount calculator 42, and the charge amount calculator 43. The charging battery state acquisition component 34 acquires the initial capacity of the charging objective battery 10. The usage battery state acquisition component 33 acquires the initial capacity of the usage battery 10. The charge/discharge ratio calculator 41 calculates the charge/discharge ratio, which is the ratio of the difference between the target charging power amount of the charging objective battery 10 and the initial capacity to the difference between the initial capacity of the usage battery 10 and the target return capacity. The decrease amount calculator 42 calculates the amount of decrease in the usage battery 10 over a specific length of time on the basis of the usage state acquired by the usage battery state acquisition component 33. The charging current determination component 37 determines the charging current by finding the product of the decrease amount and the charge/discharge ratio. The charge amount calculator 43 calculates the charge amount over a specific length of time by finding the product of the decrease amount and the charge/discharge ratio.

Consequently, the charging current can be determined so that the charge amount of the charging objective battery 10 reaches the target charging power amount when the usage battery 10 reaches the target return capacity.

3-6

The battery charging system 1 in this embodiment is a battery charging system that charges a battery 10 used in a vehicle 20 (an example of a power consumption element), and comprises the battery pairing component 32, the state transmitter 11 (an example of a usage battery state transmitter), the usage battery state acquisition component 33, and the charging current determination component 37. The battery pairing component 32 pairs up a charging objective battery 10 with a usage battery 10. The state transmitter 11 transmits the usage state of the usage battery 10. The usage battery state acquisition component 33 acquires the usage state transmitted by the state transmitter 11. The charging current determination component 37 determines the charging current of the charging objective battery 10 on the basis of the usage state acquired by the usage battery state acquisition component 33 and the charging state acquired by the charging battery state acquisition component 34.

Consequently, batteries will be left standing for less time in a state of being near the targeted charge amount (such as fully charged). Also, since no extra charging current has to be inputted to maintain the target charging power amount, energy consumption can be reduced.

A specific example of the usage battery state transmitter is the state transmitter 11 of each of the batteries 10 (A-1), 10 (B-1), and 10 (C-1) shown in FIG. 3. A specific example of the charging battery state transmitter is the state transmitter 11 of each of the batteries 10 (A-2), 10 (B-2), and 10 (C-2) shown in FIG. 3.

3-7

The battery charging method in this embodiment is a battery charging method for charging the battery 10 used in a vehicle 20 (an example of a power consumption element), and comprises a step S11 (an example of a battery pairing step), a step S17 (an example of a usage battery state acquisition step), and steps S19 to S21 (an example of a charging current determination step). Step S11 (an example of a battery pairing step) involves pairing a charging objective battery 10 with a usage battery 10. Step S17 (an example of a usage battery state acquisition step) involves acquiring the usage state of the usage battery 10. Steps S19 to S21 (an example of a charging current determination step) involve determining the charging current of the charging objective battery 10 on the basis of the state information (an example of the usage state) acquired in step S17 (an example of a usage battery state obtaining step).

Consequently, batteries will be left standing for less time in a state of being near the targeted charge amount (such as fully charged). Also, since no extra charging current has to be inputted to maintain the target charging power amount, energy consumption can be reduced.

4. Other Embodiments

An embodiment of the present invention was described above, but the present invention is not limited to or by the above embodiment, and various modifications are possible without departing from the gist of the invention.

(A)

Figure 7:
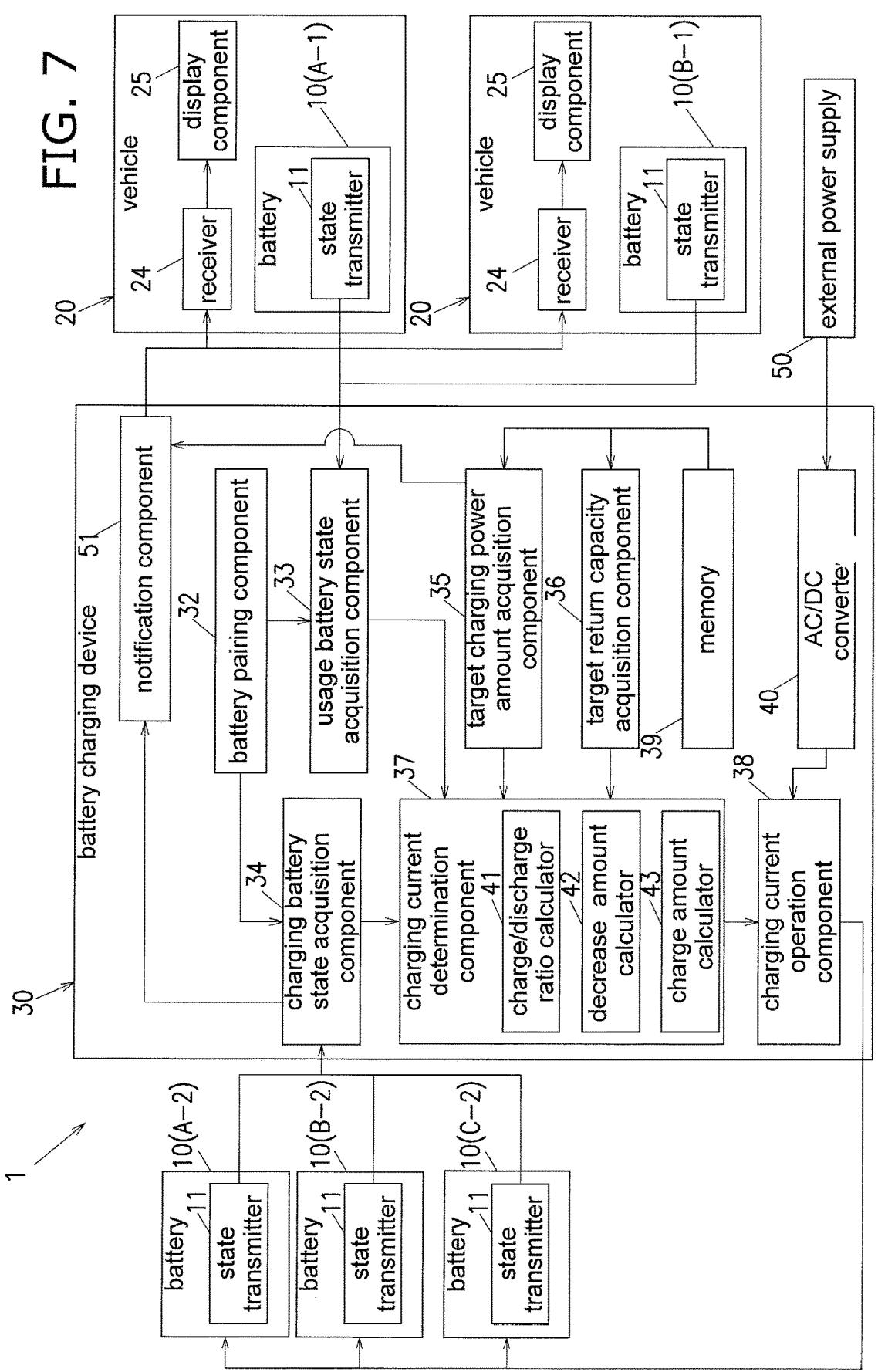
FIG. 7 is a block diagram showing the configuration of a battery charging device in a modification example of an embodiment pertaining to the present invention.

As shown in FIG. 7, the battery charging device 30 in the above embodiment may comprise a notification component 51 that notifies that the charging of the battery 10 paired with the battery 10 being used in the vehicle 20 has reached the target charging power amount. The notification component 51 detects that the charge amount of the battery 10 has reached the target charging power amount from the target charging power amount acquired via the target charging power amount acquisition component 35 and the charging power amount included in the state information acquired by the charging battery state acquisition component 34, and notifies the vehicle 20 of the result. The vehicle 20 comprises a receiver 24 and a display component 25. The receiver 24 receives the notification from the notification component 51, and causes the display component 25 to display the notification details.

Consequently, the user of the vehicle 20 can confirm that the charge amount of the charging objective battery 10 has reached the target charging power amount.

The display component 25 may be a display or the like installed in the vehicle 20, or may be a simple lamp or the like.

Also, the receiver 24 and the display component 25 need not be provided to the vehicle 20, and may instead be provided to a mobile information terminal such as a mobile telephone, a smartphone, or the like owned by the user of the vehicle 20.

(B)

Figure 8:
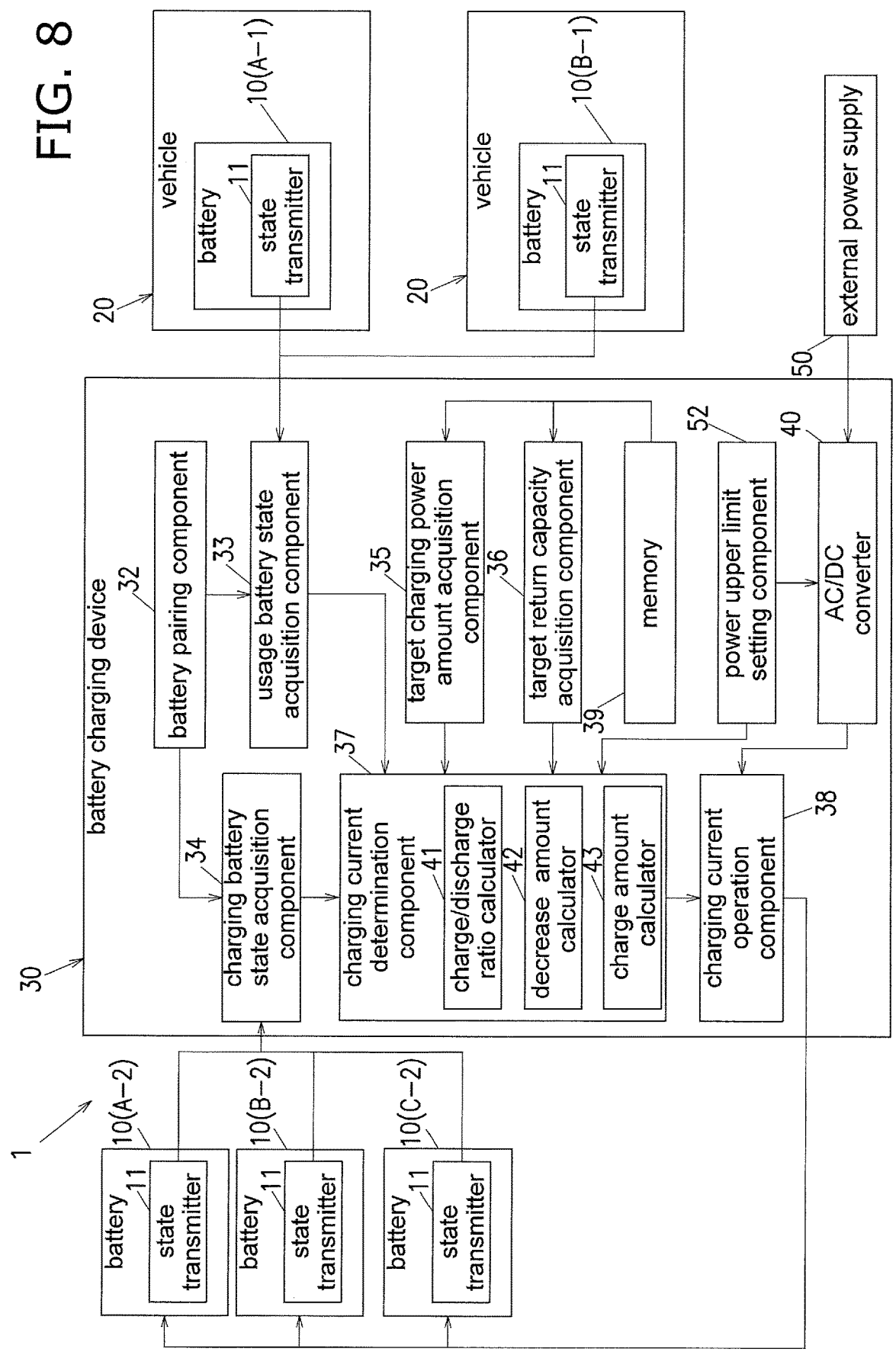
FIG. 8 is a block diagram showing the configuration of a battery charging device in a modification example of an embodiment pertaining to the present invention.

The battery charging device 30 in the above embodiment may acquire the capacity at the AC/DC converter 40 and determine the charging current on the basis of this capacity. The battery charging device 30 shown in FIG. 8 further comprises a power upper limit setting component 52. The power upper limit setting component 52 sets the upper limit of the amount of power of the AC/DC converter 40. The charging current determination component 37 determines the charging current on the basis of the upper limit of the amount of power of the AC/DC converter 40 set by the power upper limit setting component 52, in addition to the state information (an example of usage information) of the battery 10 being used and the state information (an example of charging information) of the battery 10 being charged.

Setting an appropriate upper limit to the amount of power makes it possible to conserve the AC/DC conversion capacity.

Also, if the upper limit to the amount of electric power is set to the contract demand, for example, then when a plurality of batteries 10 are being charged at the battery charging device 30 and it looks like the contract demand will be exceeded, control is performed so that the charging current is reduced for batteries 10 of low priority, so as not to exceed the contract demand. This makes it possible to control the battery charging device 30 so as not to exceed the contract demand.

(C)

In the above embodiment, the vehicle 20 was used as an example of the power consumption element in which the battery 10 was installed, but the present invention is not limited to this. The power consumption element may also be an electric power tool such as an electric drill. The power tool may be used within a limited range, such as in a factory.

Also, in the above embodiment, an electric motorcycle was used as the vehicle 20, but the vehicle may be an electric motorcycle, an electric bicycle, an electrically assisted bicycle, an electric automobile, an autonomous guided vehicle, or the like. An autonomous conveyance vehicle is, for example, an AGV (automatic guided vehicle), which are used in warehouses and so forth.

(D)

In the above embodiment, the target charging power amount was set to 80% of the chargeable total capacity and the target return capacity was set to 20% of the total capacity, but the present invention is not limited to this and these values may be set as appropriate.

(E)

Figure 9:
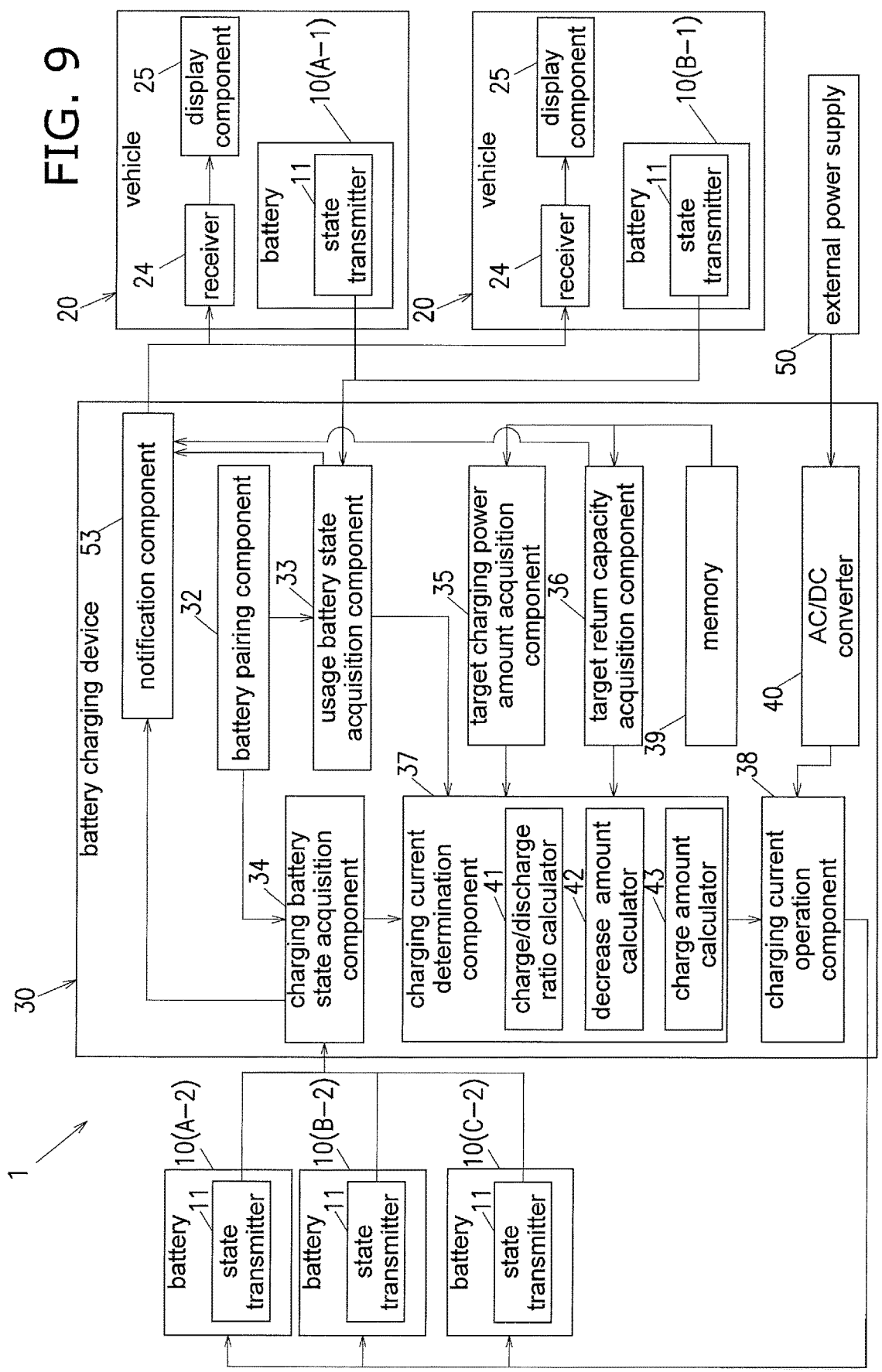
FIG. 9 is a block diagram showing the configuration of a battery charging device in a modification example of an embodiment pertaining to the present invention.

Also, a lamp which is an example of the display component may be lit to notify the user when the remaining capacity of the battery 10 being used reaches the target return capacity. The battery charging device 30 shown in FIG. 9 comprises a notification component 53 that detects that the state information (in particular, the remaining capacity) acquired from the usage battery state acquisition component 33 has reached the target return capacity acquired via the target return capacity acquisition component 36, and sends a notification to that effect. The vehicle 20 comprises the reception component 24 that receives the notification from the notification component 53, and the display component 25 that displays this notification.

When the lamp of the display component 25 is lit, the user can start heading toward the battery charging apparatus 30 in order to exchange for the paired battery 10.

The display component 25 may be a display or the like installed in the vehicle 20.

Also, the receiver 24 and the display component 25 need not be provided to the vehicle 20, and may instead be provided to a mobile information terminal such as a mobile telephone, a smartphone, or the like owned by the user of the vehicle 20.

(F)

The charging battery state acquisition component 34 was provided to the battery charging device 30 in the above embodiment, but the charging battery state acquisition component 34 need not be provided. In this case, control may be performed so as to increase the charge capacity of the charging objective battery 10 by a specific proportion (such as 1%) on the basis of the proportional decrease (the same 1%, for example) in the remaining capacity of the usage battery 10 acquired by the usage battery state acquisition component 33.

(G)

In the above embodiment, the state transmitter 11 that transmitted state information about the battery 10 was provided to the battery 10, but the vehicle 20 may have the state transmitter 11 in place of the battery 10. In this case, it is possible to communicate with the battery charging device 30 using a wireless communication chip installed in the vehicle 20.

(H)

In the above embodiment, one battery 10 was provided to the vehicle 20, but the number is not limited to one, and may be two or more.

(I)

In the above embodiment, only one battery charging device 30 was described, but a plurality of battery charging devices 30 may be provided. Also, charging stations provided with one or more of the battery charging devices 30 may be set up in a plurality of locations.

INDUSTRIAL APPLICABILITY

The battery charging device, battery charging system, and battery charging method of the present invention have the effect of reducing how long batteries are left standing near full charge, and are widely applicable to vehicles driven by replaceable batteries.

REFERENCE SIGNS LIST

1: battery charging system
10: battery
11: state transmitter
20: vehicle
20a: seat
20b: handle bar
21: motor
23: front wheel
24: receiver
25: display component
30: battery charging device
31: rechargeable battery hole
32: battery pairing component
33: usage battery state acquisition component
34: charging battery state acquisition component
35: target charging power amount acquisition component
36: target return capacity acquisition component
37: charging current determination component
38: charging current operation component
39: memory
40: AC/DC converter
41: charge/discharge ratio calculator
42: decrease amount calculator
43: charge amount calculator
50: external power supply
51: notification component
52: power upper limit setting component
53: notification component

The invention claimed is:

1. A battery charging device configured to charge a plurality of batteries configured to be used in a power consumption element, the battery charging device comprising:
   a battery pairing component configured to set a charging objective battery to be paired with a usage battery used in the power consumption element from the plurality of batteries, the charging objective battery being used in the power consumption element in exchange for the usage battery;
   a usage battery state acquisition component configured to acquire a usage state including a remaining capacity of the usage battery; and
   a charging current determination component configured to determine a charging current of the charging objective battery on the basis of the usage state acquired by the usage battery state acquisition component.

2. The battery charging device according to claim 1, further comprising a charging battery state acquisition component configured to acquire a charging state of a paired charging objective battery,
   wherein the charging current determination component determines the charging current of the charging objective battery on the basis of the usage state acquired by the usage battery state acquisition component and the charging state acquired by the charging battery state acquisition component.

3. The battery charging device according to claim 2, further comprising:
   a target charging power amount acquisition component configured to acquire a target charging power amount of the charging objective battery; and
   a notification component configured to notify a user of the power consumption element that the charge amount of the charging objective battery has reached the target charging power amount.

4. The battery charging device according to claim 1, further comprising:
   a target charging power amount acquisition component configured to acquire a target charging power amount of the charging objective battery; and
   a target return capacity acquisition component configured to acquire a target return capacity of the usage battery,
   wherein the charging current determination component determines the charging current so that when remaining capacity of the usage battery reaches the target return capacity, charge amount of the charging objective battery reaches the target charging power amount.

5. The battery charging device according to claim 1, wherein the charging current determination component:
   has a decrease amount calculator configured to calculate amount of decrease in the usage battery over a specific length of time on the basis of the usage state acquired by the usage battery state acquisition component, and
   determines the charging current on the basis of the amount of decrease over a specific length of time calculated by the decrease amount calculator.

6. The battery charging device according to claim 1, wherein the power consumption element is an electric motorcycle, an electric bicycle, an electrically assisted bicycle, an electric automobile, an autonomous conveyance vehicle, or an electric power tool.

7. A battery charging device for charging a battery used in a power consumption element, the battery charging device comprising:

a battery pairing component configured to set a charging objective battery to be paired with a usage battery;

a usage battery state acquisition component configured to acquire a usage state of the usage battery;

a charging current determination component configured to determine a charging current of the charging objective battery on the basis of the usage state acquired by the usage battery state acquisition component;

a target charging power amount acquisition component configured to acquire a target charging power amount of the charging objective battery;

a target return capacity acquisition component configured to acquire a target return capacity of the usage battery; and a charging battery state acquisition component configured to acquire a charging state of the charging objective battery set in the pair, wherein the charging current determination component determines the charging current so that when remaining capacity of the usage battery reaches the target return capacity, charge amount of the charging objective battery reaches the target charging power amount, the charging battery state acquisition component acquires initial capacity of the charging objective battery, the usage battery state acquisition component acquires initial capacity of the usage battery, the charging current determination component has:
- a charge/discharge ratio calculator configured to calculate a charge/discharge ratio that is a ratio of difference between the initial capacity and the target charging power amount of the charging objective battery to difference between the initial capacity and the target return capacity of the usage battery;
- a decrease amount calculator configured to calculate amount of decrease in the usage battery over a specific length of time on the basis of the usage state acquired by the usage battery state acquisition component; and
- a charge amount calculator configured to calculate charge amount over a specific length of time by finding a product of the amount of decrease and the charge/discharge ratio, and the charging current is determined on the basis of the calculated charge amount.

8. A battery charging system configured to charge a battery used in a power consumption element, the battery charging system comprising:

a battery pairing component configured to set a charging objective battery to be paired with a usage battery used in the power consumption element from the battery, the charging objective battery being used in the power consumption element in exchange for the usage battery;

a usage battery state transmitter configured to transmit a usage state including a remaining capacity of the usage battery;

a usage battery state acquisition component configured to acquire the usage state transmitted by the usage battery state transmitter; and a charging current determination component configured to determine a charging current of the charging objective battery on the basis of the usage state acquired by the usage battery state acquisition component.

9. A battery charging method for charging a plurality of batteries battery configured to be used in a power consumption element, the battery charging method comprising:

setting a charging objective battery to be paired with a usage battery used in the power consumption element from the plurality of batteries, the charging objective battery being used in the power consumption element in exchange for the usage battery;

acquiring a usage state including a remaining capacity of the usage battery; and determining a charging current of the charging objective battery on the basis of the acquired usage state.

\* \* \* \* \*